United States Patent [19]

Gardner

[11] Patent Number: 5,654,232
[45] Date of Patent: Aug. 5, 1997

[54] WETTING LAYER SIDEWALLS TO PROMOTE COPPER REFLOW INTO GROOVES

[75] Inventor: Donald S. Gardner, Mountain View, Calif.

[73] Assignee: Intel Corporation, Santa Clara, Calif.

[21] Appl. No.: 617,980

[22] Filed: Mar. 15, 1996

Related U.S. Application Data

[63] Continuation of Ser. No. 295,514, Aug. 24, 1994, abandoned.

[51] Int. Cl.$^6$ .................................................. H01L 21/283
[52] U.S. Cl. ........................ 438/661; 438/672; 438/687; 438/632
[58] Field of Search ............................ 437/174, 187, 437/188, 189, 192, 194, 247, 982, 190, 228

[56] References Cited

U.S. PATENT DOCUMENTS

| | | | |
|---|---|---|---|
| 4,641,420 | 2/1987 | Lee | 437/189 |
| 4,832,788 | 5/1989 | Nemiroff | 156/643.1 |
| 5,032,233 | 7/1991 | Yu et al. | 204/192.28 |
| 5,043,300 | 8/1991 | Nulman | 437/200 |
| 5,098,852 | 3/1992 | Niki et al. | 437/11 |
| 5,124,780 | 6/1992 | Sandhu et al. | 156/644.1 |
| 5,198,154 | 3/1993 | Yokoyama et al. | 252/214 |
| 5,213,638 | 5/1993 | Mahulikar et al. | 148/627 |
| 5,266,521 | 11/1993 | Lee et al. | 437/188 |

OTHER PUBLICATIONS

Wang et al., "Filling of Contacts . . . ", Jun. 12–13 1990 VMIC Conf., pp. 431–434.

Wolf, S., Silicon Processing, vol. 1, 1986, Lattice Press, pp. 161–164, 335, 75, 104–106, 182–195.

Hu et al., "Diffusion barrier . . . " Jun. 9–10, 1986, VMIC Conf., pp. 181–187.

Primary Examiner—T. N. Quach
Attorney, Agent, or Firm—Blakely, Sokoloff, Taylor & Zafman

[57] ABSTRACT

A manufacturable method for forming a highly reliable electrical interconnection. An electrical interconnection pattern is first formed in a dielectric layer on a semiconductor substrate as recessed regions in the dielectric layer. Sidewalls containing a material which wets copper are then formed against the walls within the recessed regions. A conductive layer primarily comprising copper is thereafter deposited over the surface and in the recessed regions of the dielectric layer. The conductive layer is then reflowed to fill the recessed regions of the dielectric layer with substantially no void formation.

20 Claims, 5 Drawing Sheets

WETTING LAYER SIDEWALLS TO PROMOTE COPPER REFLOW INTO GROOVES

This is a continuation of application Ser. No. 08/295,514, filed Aug. 24, 1994, now abandoned.

FIELD OF THE INVENTION

The present invention relates to semiconductor processing, and more particularly to a method of forming copper interconnects in a semiconductor device.

BACKGROUND OF THE INVENTION

As the demand for cheaper, faster, lower power consuming microprocessors increases, so must the device packing density of the integrated circuit. Very large scale integration (VLSI) techniques have continually evolved to meet the increasing demand. All aspects of the integrated circuit must be scaled down to fully minimize the device dimensions of the integrated circuit. In addition to minimizing transistor dimensions, one must minimize the dimensions of the electrical interconnections which integrate the semiconductor devices, such as transistors, together on a microchip in order to form a complete circuit.

Currently, aluminum alloys are the most commonly used conductive materials for electrical interconnections in a VLSI integrated circuit. Aluminum and its alloys have been fully characterized for use as electrical interconnections, and much technology has been developed to aid in the formation of aluminum interconnections. While aluminum has very attractive features for use as an electrical interconnection such as low electrical resistivity and strong adhesion to silicon dioxide ($SiO_2$), as VLSI dimensions reach into the deep-submicron Ultra Large Scale Integration (ULSI) regime, the deficiencies of aluminum and its alloys become limiting factors in achieving superior performance. For example, as the width of electrical interconnections becomes narrower, the resistance of aluminum becomes non-negligible and begins to contribute significantly to the resistance-capacitance (RC) time delay of the circuit. Additionally, with decreasing dimensions, design rules become increasingly restricted by aluminum interconnection reliability concerns such as electromigration, stress-induced void formation, hillock suppression, and current density limitations.

For these reasons, the microelectronics industry has recently migrated towards the investigation of more robust, more conductive metals for use in interconnection technology such as Copper (Cu). Cu is approximately 40% lower in resistivity than Al and is much more resistant to reliability problems such as electromigration. One of the main reasons why the use of Cu and its alloys for interconnection applications has not been more widespread is because a manufacturable dry-etch process has not yet been demonstrated that can pattern Cu-based materials using standard photo-lithographic techniques. Therefore, to implement the use of Cu as a microelectronic interconnection material it has become necessary to develop alternate patterning techniques.

One technique is known as damascene. In damascene, a dielectric layer is deposited onto a substrate, patterned, and etched back such that the grooves, vias, or other recessed regions etched into the dielectric layer represent the desired metal interconnection pattern. A conductive material is then deposited over the entire surface of the device, filling the recessed regions and blanketing the surface of the dielectric layer. Next, the conductive material is etched back to a degree such that the conductive material becomes electrically isolated within the recessed regions etched out of the dielectric layer.

Figure 1A:
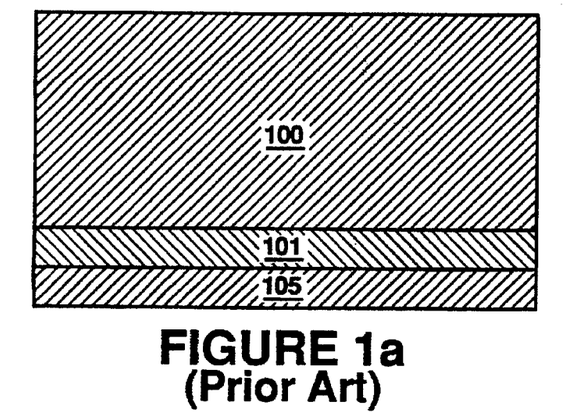
FIG. 1a is an illustration of a cross-sectional view of a semiconductor substrate.
Figure 1B:
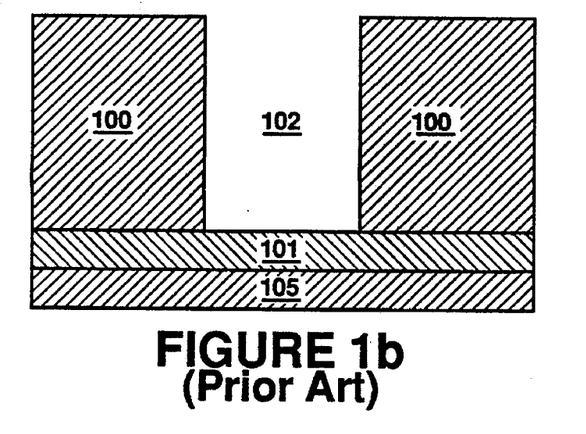
FIG. 1b is an illustration of a cross-sectional view of the substrate of FIG. 1a after a recessed region has been formed.
Figure 1C:
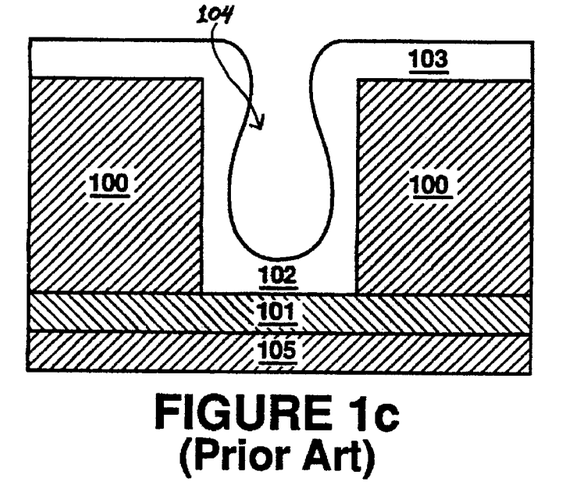
FIG. 1c is an illustration of a cross-sectional view of the substrate of FIG. 1b after a conductive layer has been deposited.

An inadequately filled recessed region in a damascene process flow leads to the creation of a void or tunnel. Voids significantly degrade semiconductor device yields thereby adding to the total manufacturing cost. FIG. 1a shows a semiconductor substrate 105 with dielectric layers 100 and 101 deposited on its surface. FIG. 1b shows the semiconductor substrate of FIG. 1a after a groove 102 has been created in dielectric layer 100. FIG. 1c shows the semiconductor substrate of FIG. 1b after a conductive layer 103 has been deposited on its surface. Note that gap 104 is beginning to form in the conductive layer 103.

As conductive material is deposited onto the substrate of FIG. 1b, the conductive material may be deposited at a faster rate on the top surface and along the walls nearer the top surface of dielectric layer 100 within groove 102 then at the bottom of groove 102. As a result, gap 104 is formed. As the walls of gap 104 close in near the top of groove 102, it becomes increasingly more difficult for the conductive material to travel to the bottom of gap 104 without "touching" and sticking to the upper walls of gap 104. The amount of conductive material deposited nearer the mouth of gap 104 is determined by how well the conductive material sticks to the substrate upon contact with it. If it sticks easily, as with sputter deposition, then less conductive material will be deposited sit the bottom of gap 104 compared to the amount of conductive material deposited nearer the mouth of gap 104. This causes a bulging or cusping effect at the mouth of gap 104 as can be seen in FIG. 1c. If the top surface of the substrate is etched back at this point, gap 104 will remain inside groove 102 leading to the problems described below as well as limiting the current carrying capability of the electrical interconnection. Therefore, it is necessary to continue depositing conductive layer 103 in order to better fill groove 102 with conductive material.

Figure 1D:
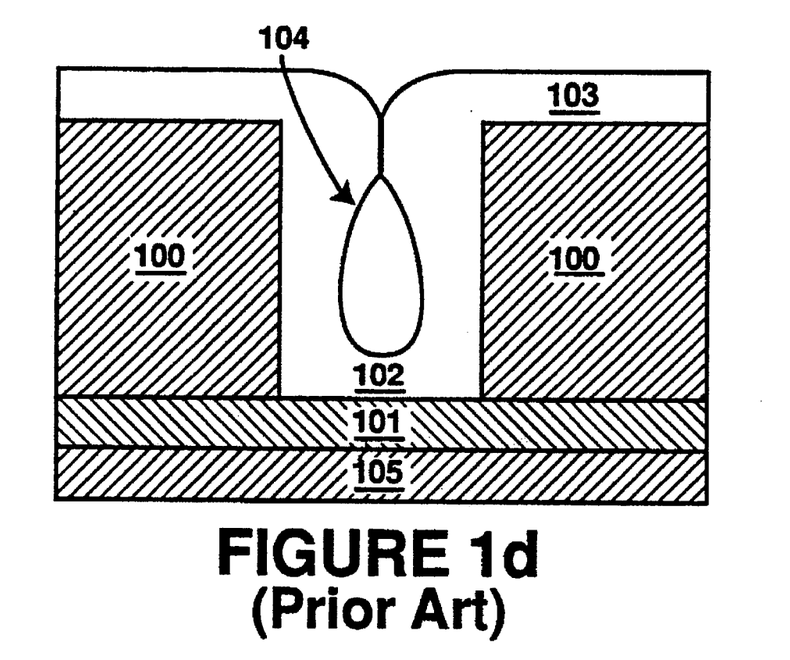
FIG. 1d is an illustration of a cross-sectional view of the substrate of FIG. 1c after more conductive material has been deposited.
Figure 1E:
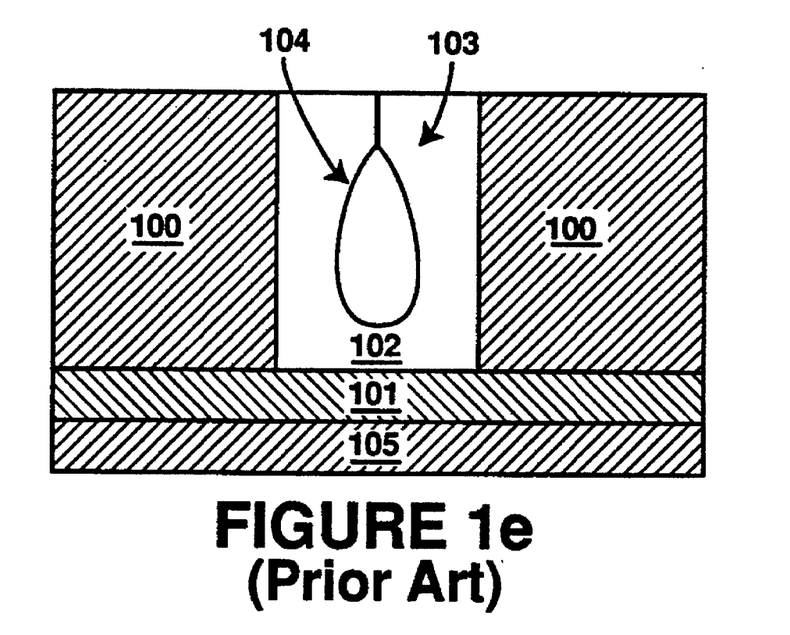
FIG. 1e is an illustration of a cross-sectional view of the substrate of FIG. 1d after the surface has been etched back.

FIG. 1d shows the result of continued deposition of a conductive material when the sticking coefficient is high. Note the cusping of the walls at the mouth of gap 104. The result of this cusping is that the bottom of the gap has been sealed off from the surface of the substrate. Thus, the gap has evolved into a tunnel traveling along groove 102. Such a tunnel is known as a void. Gaps and voids can cause significant problems in a semiconductor manufacturing process and are considerable issues for sputtered and evaporated films. One problem with gaps and voids is that they can trap impurities which can harm the semiconductor device in subsequent process steps. For example, FIG. 1e shows the semiconductor substrate of FIG. 1d after the surface of conductive layer 103 has been etched back to isolate the portion of conductive layer 103 residing within groove 102 of dielectric layer 100. The isolated conductive layer 103 will become an electrical interconnection of the device. Note that void 104 still exists within the electrical interconnection 103.

Assuming conductive layer 103 of FIG. 1d was etched back using some sort of chemical etching process, the etchant chemicals may become trapped within the gap or hollow void 104 and cause additional etching or corrosion of electrical interconnection 103 even after the etchant has been removed from the surface of the substrate. These trapped etchant chemicals may then contaminate the semiconductor device which could degrade reliability. Trapped etchant chemicals may also continue to etch the electrical interconnection 103 resulting in the thinning of electrical interconnection 103 or the creation of a electrical open, thereby resulting in a failure. Interconnection thinning may lead to reliability problems such as electromigration and current-carrying limitations. Additionally, trapped contaminants may expand upon subjecting the semiconductor substrate to subsequent high temperature processing steps. Such expansion could cause significant damage to adjoining surface features of the semiconductor device. Finally, trapped contaminants may escape during a subsequent process step conducted within a process chamber, thereby contaminating all other semiconductor devices within the chamber.

Note that the potential for forming voids is greatly increased by attempting to fill grooves of significantly varying widths together on a single substrate at the same interconnection level using deposition processes with relatively high sticking coefficients. This is because these deposition processes are typically optimized to fill a groove of a particular width. While such optimization techniques may be suitably employed to fill interconnections of this particular width on a semiconductor substrate, the problem is that grooves of widths for which the process has not been optimized run a much higher risk of void formation. This makes interconnection technology dependent on individual device layout. Such dependence degrades the manufacturability of such processes.

It is currently more desirable to form copper interconnections on a semi conductor substrate by Cu sputtering rather than by CVD of Cu. One reason why Cu sputtering is more desirable is that there is a significant cost associated with performing CVD of Cu. Equipment necessary to form CVD Cu layers is currently under development and not yet readily available for high production manufacturing environments. Additionally, the materials necessary to deposit CVD Cu layers are expensive, still under investigation, and the films are not likely to be very pure. Therefore, CVD of Cu is expensive and considerably adds to the total manufacturing cost of a semiconductor device. Also, it is not yet known if certain important alloys of Cu are capable of being deposited using a CVD system. Furthermore, while some CVD techniques which exhibit low sticking coefficients may be capable of minimizing void formation, seams are still formed along the center of the CVD layers within the grooves. Seams are formed when deposited materials on laterally opposing walls within a groove grow into each other. These seams may be undesirable due to, for example, their negative impact on the grain size of the conductive layer and their susceptibility to trapping impurities. Finally, CVD techniques which exhibit low sticking coefficients also exhibit low deposition rates. Therefore, in the interest of manufacturability, higher sticking coefficient CVD processes are typically used to accelerate throughput time. However, these higher sticking coefficient CVD processes exhibit the same short-comings as the high sticking coefficient processes discussed above.

Existing sputter deposition systems can easily and cheaply deposit Cu layers and the alloys of these layers. However, sputter deposition systems have exhibited significant limitations in their ability to fill recessed regions in a damascene process flow as discussed above. These limitations have restricted the applicability of sputter deposition systems in a damascene process.

SUMMARY OF THE PRESENT INVENTION

A manufacturable method for forming a copper electrical interconnection for an advanced semiconductor device is described. First, grooves are formed in a dielectric layer on a semiconductor substrate. A wetting layer is then conformally deposited and anisotropically etched to form wetting layer sidewalls within the groove. Copper, or an alloy thereof, is then sputtered over the entire surface of the substrate such that open gaps are created in the copper layer caused by the grooves in the underlying dielectric layer. Oxidation of the copper layer is prevented by maintaining a vacuum during the time between sputtering the copper layer and subjecting the copper layer to a subsequent reflow process step. The reflow process consists of exposing the copper layer to elevated temperatures under high vacuum to ultra high vacuum conditions. During the reflow process, the wetting layer sidewalls promote filling of the grooves in the dielectric layer with copper, while gaps, voids, and seams are substantially eliminated. The surface of the copper layer is then chemically-mechanically polished back such that the copper remains only in the grooves of the dielectric layer. These grooves containing the copper then act as a layer of electrical interconnections for the device.

DETAILED DESCRIPTION

A manufacturable method for forming a highly reliable electrical interconnection is described which is particularly well suited for advanced VLSI and ULSI applications. In the following description, numerous specific details such as layer thicknesses, process sequences, times, temperatures, etc. are set forth in order to provide a more thorough understanding of the present invention. It will be obvious, however, to one skilled in the art, that the present invention may be practiced without employing these specific details. In other instances, well-known processes and processing techniques have not been described in detail in order to avoid unnecessarily obscuring the present invention.

While diagrams representing an embodiment of the present invention are illustrated in FIGS. 2a–2g, these illustrations are not intended to limit the invention. The specific processes described herein are only meant to help clarify an understanding of the present invention and to illustrate certain embodiments of how the present invention may be implemented in order to form a device in accordance with the present invention. For the purposes of this discussion, a semiconductor substrate is any substrate comprising any material or materials used in the manufacture of a semiconductor device. A substrate is a structure on which or to which a processing step acts upon.

Figure 2A:
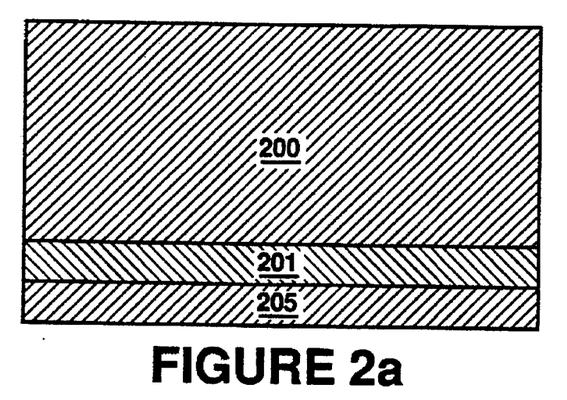
FIG. 2a is an illustration of a cross-sectional view of a semiconductor substrate.

In a accordance with the present invention, layer 205 of FIG. 2a is a semiconductor substrate which may include semiconductor, dielectric, or conductive layers. Semiconductor substrate 205 contains active devices which may be integrated by the process of the present invention. Layer 201 of FIG. 2a is a dielectric layer used to physically and electrically isolate the subsequently deposited conductive layer 203 from the rest of the semiconductor device. Layer 200 of FIG. 2a is another dielectric layer which also serves to physically and electrically isolate the subsequently deposited conductive layer 203 from the rest of the semiconductor device. The electrical interconnection formed by the process of the present invention may serve as, for example, a metal 1, metal 2, metal 3, or any other interconnection layer in a multilevel interconnection device, or a contact or via.

Examining FIG. 2a, dielectric layers 200 and 201 are formed on the substrate 205. Dielectric layers 200 and 201 are typically $SiO_2$ (oxide), but may be silicon nitride (nitride), silicon oxynitride, BSG, PSG, BPSG, silicon carbide, other organic dielectrics such as polyimide, or any other dielectric material which is compatible with a semiconductor manufacturing technology. Alternatively, dielectric layers 200 and 201 may comprise a multilayer stack including dielectric materials and, perhaps, other types of materials which may exhibit semiconductive or even conductive properties. Also, dielectric layer 200 may comprise the same material as dielectric layer 201. In the latter case, dielectric layers 200 and 201 may be formed as a single layer or multilayer stack onto semiconductor substrate 205.

Figure 2B:
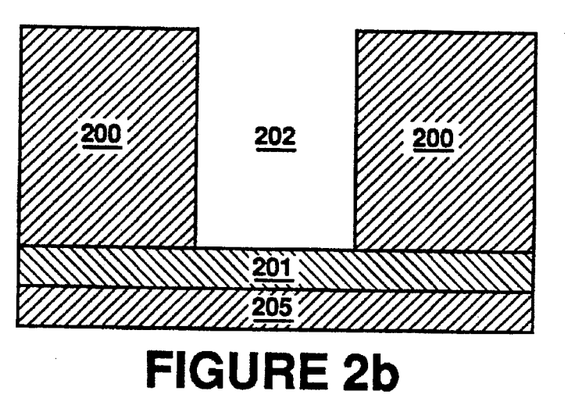
FIG. 2b is an illustration of a cross-sectional view of the substrate of FIG. 2a after a recessed region has been etched.

FIG. 2b shows the same region displayed in FIG. 2a after a portion of dielectric layer 200 has been etched to form a recessed region or groove 202 therein. Recessed region 202 may be only a portion of a larger groove (running substantially perpendicular to the page) in order to form a layer of electrical interconnections. Groove 202 may be formed by any one of a plurality of well known etch processes such as RIE, sputter etch, ion milling, or even wet chemical etch. In one method, dielectric layer 201 is used as an etch-stop for the dry etch of layer 200 to form groove 202. In another method where dielectric layer 200 comprises the same material as dielectric layer 201, a timed etch would be more appropriate. In alternate embodiments of the present invention, FIG. 2b is not formed as a result of etching groove 202 into layer 200 but rather by selectively growing or depositing layer 200 about the groove 202. In yet another embodiment of the present invention in which a cross-level electrical shunt is to be formed, such as a vertical via, plug, or contact, groove 202 is etched deep enough to make contact with an underlying electrical interconnection layer. Vias, plugs, contacts, electrical interconnection layers, and other structures with current carrying capacity are herein generically termed electrically conductive layers.

The width of groove 202 may be in the range of approximately 1 micron to well within the deep sub-micron regime of 0.1 microns and below. The aspect ratio of groove 202 (depth/width) may be in the range of approximately 0.5 to four. In alternate embodiments of the present invention, grooves of even higher aspect ratios may be formed. Grooves with aspect ratios below 0.5 are generally adequately filled by conventional deposition techniques such as sputtering without the aid of the reflow process described below, however, the reflow process additionally serves to improve the step coverage and general film quality of these wide lines. Since the reflow process does not substantially interfere with these adequately filled wide grooves, the present invention is well suited for simultaneously creating electrical interconnection dimensions of vastly differing widths on a single substrate surface. The depth of groove 202 (and hence the thickness of dielectric layer 200) is approximately 500 nm. However, the depth of groove 202 may be in the range of approximately 100 nm to 5000 nm. Where a recessed region needs to be very deep to accommodate, for instance, a deep vertical via or contact, a recessed region may be as deep as approximately 1 micron. Typically, the walls of groove 202 are substantially vertical to minimize lateral dimensions thereby improving packing density.

Figure 2C:
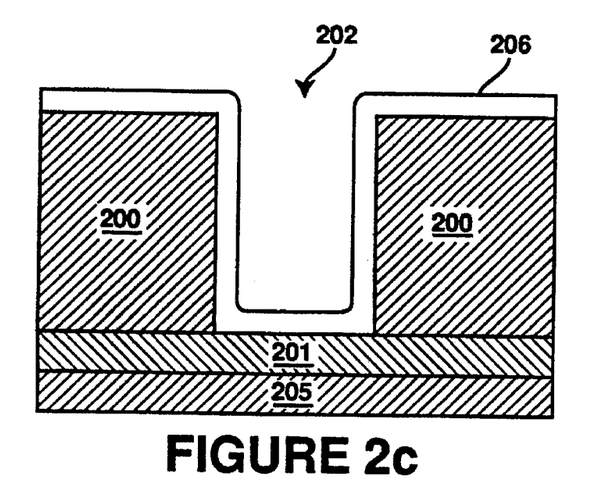
FIG. 2c is an illustration of a cross-sectional view of the substrate of FIG. 2b after a wetting layer has been deposited.

FIG. 2c illustrates the substrate shown in FIG. 2b after a wetting layer 206 has been formed. Wetting layer 206 will serve to prevent copper layer 203 from agglomerating out of groove 202 during a subsequent reflow step as described below. In one embodiment of the present invention, wetting layer 206 comprises silicon nitride (nitride) which is deposited by a process capable of forming a substantially conformal nitride layer along the walls of groove 202 as shown in FIG. 2c. An additional benefit of using nitride for wetting layer 206 is that nitride is known to act as a good barrier to copper diffusion. CVD and PECVD are two such processes capable of forming conformal nitride layers. Alternatively, nitridation of the silicon within dielectric layer 200 may also be used to form a conformal nitride layer along the walls of groove 202. In an alternate embodiment of the present invention, wetting layer 206 comprises tantalum (Ta) which is deposited by a process capable of forming a substantially conformal Ta layer along the walls of groove 202. In general, wetting layer 206 may comprise any material which wets a Cu layer, and may be deposited by any conformal deposition technique. The wetting phenomenon is described below in conjunction with the reflow process step.

Figure 2D:
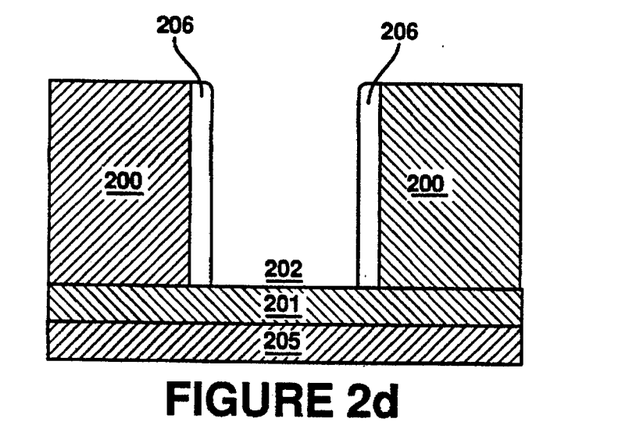
FIG. 2d is an illustration of a cross-sectional view of the substrate of FIG. 2c after the wetting layer has been etched.

After wetting layer 206 is formed, an anisotropic etch is performed to remove wetting layer 206 from substantially horizontal surfaces of the substrate of FIG. 2c, such as the surface of dielectric layer 200 and the bottom of groove 202. RIE, plasma, or sputter etch are techniques which may be used to anisotropically etch wetting layer 206. As illustrated in FIG. 2d, at the completion of the anisotropic etch, only the portion of wetting layer 206 which was formed on the walls of groove 202 will remain, creating wetting layer sidewalls 206 of groove 202.

For most conformal deposition techniques, the thickness of wetting layer 206 deposited on horizontal surfaces is approximately equal to the thickness of wetting layer 206 deposited on the walls of groove 202 as shown in FIG. 2c. Therefore, the thickness of the sidewalls formed from wetting layer 206 shown in FIG. 2d depends on the deposited thickness of wetting layer 206 in FIG. 2c. There are two competing factors which a practitioner should consider in determining the proper thickness for wetting layer 206. First, as wetting layer 206 increases in thickness, less volume will be available within groove 202 for subsequent Cu filling since the sidewalls formed from wetting layer 206 encroach into groove 202 as shown in FIG. 2d. By allowing less room for the Cu interconnect material, thicker wetting layers result in thinner interconnects which can slow device speed (by increasing resistance) and represent electromigration and other reliability hazards. Therefore, wetting layer 206 should be as thick as possible without negatively impacting interconnect performance.

However, the second factor which a practitioner should consider in determining the proper thickness for wetting layer 206 is that if wetting layer 206 is not thick enough, wetting layer 206 may not adequately wet the subsequently deposited Cu layer. Furthermore, if wetting layer 206 is not thick enough, wetting layer materials which have Cu barrier properties, such as nitride, cannot adequately function as a good barrier layer to Cu diffusion. Therefore, wetting layer 206 should be as thin as possible while still providing adequate wetting and barrier layer properties. It has been found that a wetting layer 206 thickness in the range of approximately 200 Å–400 Å strikes an adequate balance between these two competing factors in many applications. However, as advancing semiconductor technologies shrink the device dimensions of groove 202 towards widths of 0.1 μm and below, wetting layer 206 may be formed as thin as approximately 50 Å, or 20 Å for sub-0.1 μm grooves. Finally, it should be noted that in alternate embodiments, wetting layer 206 may comprise a multilayer stack where, for example, one type of material in the stack provides wetting properties while the other provides Cu barrier properties.

Figure 2E:
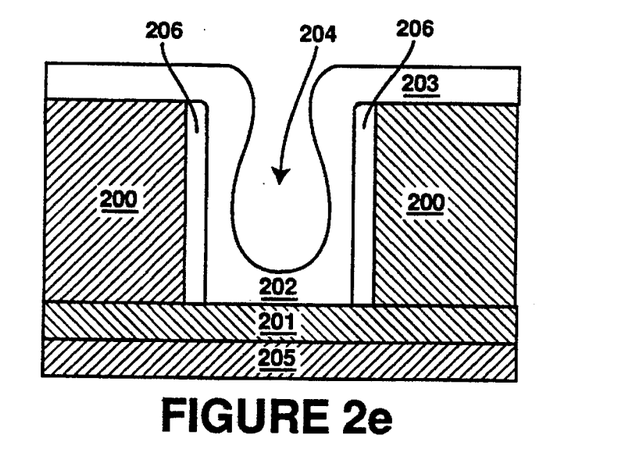
FIG. 2e is an illustration of a cross-sectional view of the substrate of FIG. 2d after a conductive layer has been deposited.

FIG. 2e shows the same region displayed in FIG. 2d after a conductive layer 203 has been deposited. Conductive layer 203 substantially comprises Cu as its primary element and may include alloys thereof such as a vanadium alloy of Cu, a niobium alloy of Cu, or a palladium alloy of Cu. In an embodiment of the present invention in which conductive layer 203 comprises copper with an additive of vanadium, niobium, or palladium, these additives comprise between approximately 0.01 and 2 atomic percent of the conductive material. Cu may be alloyed with any number of dilute quantities of other elements. For example, aluminum may be included in conductive layer 203 to prevent corrosion of the layer. In order to reduce manufacturing costs while improving semiconductor device quality, a preferred embodiment of the present invention uses well known sputter deposition processes to deposit conductive layer 203. In alternate embodiments of the present invention, CVD, evaporative, or plasma deposition techniques may be used to deposit all or at least a portion of conductive layer 203. In addition, conductive layer 203 may include other layers comprising materials suitable for use as, for example, diffusion barriers, surface adhesion layers, or electrical contact layers. Alternatively, conductive layer 203 may comprise silver instead of or in addition to Cu, an alloy of silver, or any other low resistance conductive material.

Figure 2F:
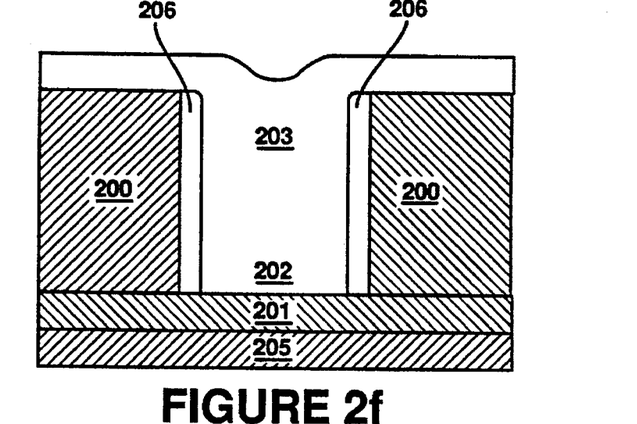
FIG. 2f is an illustration of a cross-sectional view of the substrate of FIG. 2e after the conductive layer has been reflowed.

Note gap 204 formed in conductive layer 203 of FIG. 2e. In a preferred embodiment of the present invention, conductive layer 203 is deposited over the entire substrate to a thickness such that gap 204 remains open. For example, in an embodiment in which groove 203 is approximately 500 nm deep, conductive layer 203 may be deposited to a thickness of approximately 1.6 microns without prematurely closing gap 204 and forming a void. As discussed above, deposition to a thickness beyond a certain point will cause the cusps at the upper walls of the gap to meet, thereby forming a void at the base of the gap. In accordance with a preferred embodiment of the present invention, gap 204 is completely sealed or filled by a subsequent reflow step which eliminates any gaps, voids, or seams in the conductive layer 203. Note that if a void is actually formed upon deposition of conductive layer 203, the subsequent reflow step may not be able to adequately seal the gap. The result of the reflow step is shown in FIG. 2f.

A reflow step is a process step in which conductive layer 203 is exposed to an elevated temperature under vacuum for a period of time necessary to cause conductive layer 203 to "smooth out" and substantially seamlessly seal gap 204. The elevated temperatures of the reflow step may be obtained by subjecting the substrate to energy sources such as, for example, radiative, furnace, lamp, microwave, or hot gas. For example, in one method consistent with the present invention, a reflow step consisting of approximately 400° C. for 30 minutes under a vacuum of approximately $3 \times 10^{-9}$ torr has been found to achieve the desired result. It has been observed that depositing the conductive layer at low temperatures (below approximately 150° C.) improves the subsequent reflow characteristics of the film. For example, gap 204 is more substantially sealed by a reflow process when conductive layer 203 has been sputtered at a low temperature. By depositing conductive layer 203 at higher temperatures, the reflow time may be reduced due to simultaneous partial reflow and high temperature deposition, however the groove 202 may not be completely filled leading to void formation.

The driving force for the reflow of conductive layer 203 into groove 202 is believed to be the minimization in surface free energy in combination with sidewalls comprising wetting layer 206. This can be viewed at the molecular level as the energy necessary to break the bonds in order to create surface area. The more surface area that is created, the higher the number of bonds that are broken. Therefore, more surface area indicates more surface energy. There are several possible mechanisms that may lead to surface smoothing such as viscous flow, surface diffusion, volume diffusion, and evaporation-condensation or transport through the vapor. Viscous flow is applicable for amorphous materials (e.g. glass), and volume diffusion is important at higher temperatures. For the present invention, it is believed that surface diffusion and some volume diffusion are the two main mechanisms by which the reflow step works.

Wetting layer 206 serves to wet conductive layer 203 in groove 202 by providing conductive layer 203 with a low interfacial energy within groove 202. It has been found that without wetting layer 206, upon reflow, conductive layer 203 may agglomerate out of groove 202 and "ball-up" at the upper edges of groove 202. This phenomenon of conductive layer 203 agglomerating out of groove 202 is particularly more pronounced when attempting to reflow conductive layer 203 into grooves having high aspect ratios, such as those greater than approximately 2. Wetting layer 206 inhibits agglomeration, or "balling-up" of conductive layer 203 by flattening out conductive layer 203 along the walls of groove 202 upon reflow. As a result, wetting layer 206 has the perceived effect of actually drawing conductive layer 203 into groove 202.

It is important to note that surface diffusion and evaporation-condensation would be impeded by the formation of an oxide layer, so reflow should preferably be done in a vacuum or pure inert atmosphere. For this reason, a preferred embodiment of the present invention maintains conductive layer 203 under very high to ultra high vacuum conditions between and during the deposition of at least a portion of conductive layer 203 and the subsequent reflow process step. In alternate embodiments of the present invention, conductive layer 203 is kept under an inert atmosphere during the critical time period between the deposition of conductive layer 203 and the reflow step. Still alternate embodiments of the present invention keep conductive layer 203 under at least high vacuum conditions, perhaps in addition to maintaining an inert ambient, during this critical time period. To improve the manufacturability of the present invention, the deposition and reflow process steps may be performed within the same vacuum system without significantly breaking the vacuum. Generally, high vacuum is considered to be a pressure between approximately $1\times10^{-3}$ torr and $1\times10^{-6}$ torr, very high vacuum between approximately $1\times10^{-6}$ torr and $1\times10^{-9}$ torr, ultra high vacuum between approximately $1\times10^{-9}$ torr and $1\times10^{-12}$ torr, and extreme high vacuum between approximately $1\times10^{-12}$ torr and $1\times10^{-15}$ torr. An inert atmosphere for copper may include nitrogen or any of the noble gases such as argon. In this manner, the potential for the formation of an oxide layer on the surface of the conductive layer 203, which may inhibit the reflow process, is significantly reduced or eliminated.

In a preferred embodiment of the reflow process step, conductive layer 203 is exposed to a temperature below approximately 500° C. However, conductive layer 203 may be exposed to temperatures in the range of approximately 200° C.–800° C. with the range of approximately 300° C.–650° C. being preferred. Various temperature ramping schemes may be utilized in order to better control the reflow process to promote complete sealing of gap 204. Note that reflowing too quickly may cause void formation. In general, the upper limit on the temperature to which conductive layer 203 may be exposed depends on the underlying substrate materials. For example, if an aluminum layer is included in the underlying substrate, the reflow temperature should be kept below the minimum temperature at which the aluminum layer melts (660° C.), its barrier layer is consumed, junction spiking occurs, damaging hillocks are formed, or any other damage to the device or severe degradation in its reliability can result. It is also important to keep reflow temperatures low enough to prevent any previously deposited oxide layers from reflowing. Because it may be necessary to keep the reflow temperature low, it is fortunate, and indeed surprising, that copper may be reflowed at temperatures below approximately 400° C. (estimated actual surface temperature), less than half of copper's melting point of 1083° C. Note that all temperatures offered herein in conjunction with the reflow process, unless otherwise noted, are based on embedded thermocouple measurements within the silicon wafer within the reflow chamber.

FIG. 2f illustrates the cross section of FIG. 2e after the reflow step has been performed. Note how the reflow step has completely sealed gap 204 of FIG. 2e. Contrasting this with gap 104 of FIG. 1c or the void of FIG. 1d, an advantage of the present invention over the prior art can be seen. Groove 202 has been more completely filled by conductive layer 203 during the reflow step than groove 202 would have been filled by continued deposition of a thicker conductive layer 203. Since the gap 204 of FIG. 2e has been virtually eliminated, the problems associated with gaps, voids, and seams, some of which have been discussed above, have also been eliminated. Conductive layer 203 may now be etched back to confine the conductive layer 203 to groove 202.

Figure 2G:
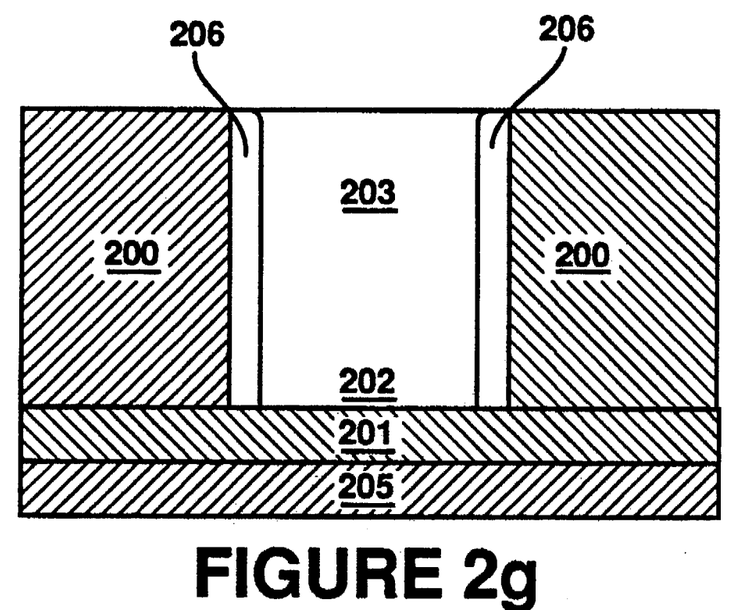
FIG. 2g is an illustration of a cross-sectional view of the substrate of FIG. 2f after the surface has been etched back.

FIG. 2g shows the cross section of FIG. 2f after the completion of an etch back process step. In the embodiment of the present invention illustrated in FIG. 2g, well known chemical-mechanical polishing process techniques have been used to etch conductive layer 203 from the upper surfaces of dielectric layer 200. Thus, the portion of the conductive layer 203 which exists substantially outside groove 202 is removed, thereby isolating conductive layer 203 to within groove 202. In one embodiment of the present invention, an upper portion of dielectric layer 200 is also removed as part of an over-etch process to be sure the portion of conductive layer 203 which resides substantially outside groove 202 has been removed. In an alternate embodiment of the present invention, an alternate etch process such as wet chemical etch, RIE, back sputter, ion mill, or mechanical polishing can be used to remove the portion of conductive layer 203 which resides substantially outside groove 202. Note, however, that mechanical etching techniques, such as polishing, additionally serve to planarize the surface of the substrate, an advantage which may not be achieved by purely chemical etching techniques.

Alternatively, the step of anisotropically etching wetting layer 206, as described in conjunction with FIG. 2d, is eliminated. In an embodiment in which the underlying layer 201 is conductive and wetting layer 206 is not anisotropically etched back, wetting layer 206 should be conductive in order to allow electrical contact between conductive layer 203 and layer 201.

Thus a novel electrical interconnection manufacturing process has been described which improves the manufacturability, quality, reliability, and performance of semiconductor devices. This process is compatible with advanced VLSI and ULSI process techniques.

It is claimed:

1. A method of forming an electrical conductor over a semiconductor substrate, said method comprising the steps of:
   (a) forming a recessed region in a first layer above said semiconductor substrate;
   (b) forming sidewalls adjacent to each of two laterally opposing walls within said recessed region by conformally depositing a wetting layer within said recessed region and subsequently anisotropically etching said wetting layer, said wetting layer comprising a wetting material which wets copper;
   (c) forming a second layer above said first layer such that at least a portion of said second layer is formed in said recessed region, said second layer comprising pure copper or copper alloyed with a dilute quantity of other elements; and
   (d) reflowing said second layer.

2. The method of claim 1 wherein at least a portion of said second layer is deposited by a method selected from the group consisting of sputtering, CVD, and evaporation.

3. The method of claim 2 wherein said second layer is formed and said reflow is performed under high vacuum to ultra high vacuum conditions within the same vacuum system.

4. The method of claim 2 wherein said reflow is performed at a temperature in the range of approximately 200° C.–800° C.

5. The method of claim 1 wherein said second layer is formed and said reflow is performed under high vacuum to ultra high vacuum conditions within the same vacuum system.

6. The method of claim 1 wherein said wetting material is selected from the group consisting of silicon nitride, Ta, and any combination thereof.

7. The method of claim 1 wherein said reflow is performed at a temperature in the range of approximately 200° C.–800° C.

8. The method of claim 1 further comprising the step of etching at least a portion of said second layer which exists outside said recessed region such that said second layer becomes substantially isolated within said recessed region.

9. The method of claim 1 wherein said second layer comprises a material selected from the group consisting essentially of pure copper, a vanadium alloy of copper, a niobium alloy of copper, a palladium alloy of copper, and any combination thereof.

10. The method of claim 1 wherein said second layer comprises pure copper to which elements are added in an amount of between approximately 0.01 to 2 atomic percent to form an alloy thereof.

11. The method of claim 1 wherein said recessed region is formed by a process including dry etching a dielectric region of said first layer, said dielectric region comprising a material selected from the group consisting essentially of oxide, nitride, silicon oxynitride, BSG, PSG, BPSG, silicon carbide, polyimide and any combination thereof.

12. The method of claim 1 wherein said second layer is deposited in an inert atmosphere and is maintained in said inert atmosphere until after said reflow is performed.

13. A method of forming an electrical conductor over a semiconductor substrate, said method comprising the steps of:

(a) forming a recessed region in a first layer over said semiconductor substrate, said first layer comprising a dielectric material;

(b) forming sidewalls adjacent to each of two laterally opposing walls within said recessed region by conformally depositing a wetting layer within said recessed region and subsequently anisotropically etching said wetting layer, said wetting layer being capable of wetting copper;

(c) sputtering a second layer above said first layer such that at least a portion of said second layer is deposited in said recessed region, said second layer comprising pure copper or copper alloyed with a dilute quantity, of other elements; and (d) reflowing said second layer by exposing said second layer to a temperature in the range of approximately 200° C.–800° C. under high vacuum to ultra high vacuum conditions.

14. The method of claim 13 wherein at least a portion of said wetting layer is deposited by a method selected from the group consisting of CVD, PECVD, and nitridation.

15. The method of claim 14 wherein said wetting layer is formed to a thickness in the range of approximately 50 Å–400 Å.

16. The method of claim 14 further comprising the step of chemically-mechanically etching at least a portion of said second layer which exists outside said recessed region such that said second layer becomes substantially isolated within said recessed region.

17. The method of claim 13 wherein said second layer is deposited and said reflow is performed under high vacuum to ultra high vacuum conditions within the same vacuum system.

18. The method of claim 13 wherein said reflow is performed at a temperature below approximately 500° C.

19. The method of claim 13 further comprising the step of chemically-mechanically etching at least a portion of said second layer which exists outside said recessed region such that said second layer becomes substantially isolated within said recessed region.

20. The method of claim 15 wherein said wetting layer comprises a material selected from the group consisting of silicon nitride, Ta, and any combination thereof.

* * * * *